US010725332B2

(12) United States Patent
Lee et al.

(10) Patent No.: US 10,725,332 B2
(45) Date of Patent: Jul. 28, 2020

(54) DISPLAY DEVICE

(71) Applicant: LG CHEM, LTD., Seoul (KR)

(72) Inventors: Ilha Lee, Daejeon (KR); Jin Hyong Lim, Daejeon (KR); Ki-Hwan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/758,331

(22) PCT Filed: Oct. 6, 2016

(86) PCT No.: PCT/KR2016/011162
§ 371 (c)(1),
(2) Date: Mar. 7, 2018

(87) PCT Pub. No.: WO2017/061776
PCT Pub. Date: Apr. 13, 2017

(65) Prior Publication Data

US 2018/0259809 A1 Sep. 13, 2018

(30) Foreign Application Priority Data

Oct. 6, 2015 (KR) ........................ 10-2015-0140574

(51) Int. Cl.
*G02F 1/1335* (2006.01)
*G02F 1/1362* (2006.01)
(Continued)

(52) U.S. Cl.
CPC ...... *G02F 1/133514* (2013.01); *G02F 1/1343* (2013.01); *G02F 1/1368* (2013.01); *G02F 1/133512* (2013.01); *G02F 1/133553* (2013.01); *G02F 1/133617* (2013.01); *G02F 1/136209* (2013.01); *G02F 1/136286* (2013.01);
(Continued)

(58) Field of Classification Search
CPC . H01L 51/5284; H01L 51/52; H01L 27/3272; H01L 27/12; H01L 33/136209; H01L 27/288; H01L 25/048; H01L 27/32; H01L 27/30; H01L 33/08; G02F 1/1335; G02F 1/1343; G02F 1/1368; G02F 1/133512; G02F 1/133553; G02F 1/136286; G02F 1/133514; G02F 1/136209; G02F 1/133617; G02F 2203/68; G02F 2001/1351; G02F 1/134363; G02F 1/133509; G02F 1/15165; G02F 2001/1518; G02F 2001/15145; G02F 1/1354; G02F 1/15; G02F 2001/136222
See application file for complete search history.

(56) References Cited

U.S. PATENT DOCUMENTS 5,592,317 A * 1/1997 Fujikawa .......... G02F 1/133512
349/105
6,157,426 A * 12/2000 Gu .................. G02F 1/133512
257/72
(Continued)

FOREIGN PATENT DOCUMENTS

CN 102981329 3/2013
CN 103412697 11/2013
(Continued)

*Primary Examiner* — Hoan C Nguyen
(74) *Attorney, Agent, or Firm* — Dentons US LLP

(57) ABSTRACT

The present invention relates to a display device.

10 Claims, 7 Drawing Sheets

101a
201a
201b
101b
301

(51) Int. Cl.

| | |
|---|---|
| ***G02F 1/13357*** | (2006.01) |
| ***H01L 27/28*** | (2006.01) |
| ***H01L 25/04*** | (2014.01) |
| ***H01L 27/32*** | (2006.01) |
| ***H01L 27/30*** | (2006.01) |
| ***H01L 33/08*** | (2010.01) |
| ***H01L 51/52*** | (2006.01) |
| ***G02F 1/1343*** | (2006.01) |
| ***G02F 1/1368*** | (2006.01) |
| *G02F 1/135* | (2006.01) |
| *G02F 1/15* | (2019.01) |
| *G02F 1/1516* | (2019.01) |
| *G02F 1/1514* | (2019.01) |
| *H01L 29/786* | (2006.01) |

(52) U.S. Cl.

CPC .......... *H01L 25/048* (2013.01); *H01L 27/288* (2013.01); *H01L 27/30* (2013.01); *H01L 27/32* (2013.01); *H01L 27/3272* (2013.01); *H01L 33/08* (2013.01); *H01L 51/52* (2013.01); *H01L 51/5284* (2013.01); *G02F 1/1354* (2013.01); *G02F 1/133509* (2013.01); *G02F 1/134363* (2013.01); *G02F 1/15* (2013.01); *G02F 1/15165* (2019.01); *G02F 2001/1351* (2013.01); *G02F 2001/136222* (2013.01); *G02F 2001/1518* (2019.01); *G02F 2001/15145* (2019.01); *G02F 2203/68* (2013.01); *H01L 29/78633* (2013.01)

(56) References Cited

U.S. PATENT DOCUMENTS

| | | | | |
|---|---|---|---|---|
| 6,342,970 | B1 * | 1/2002 | Sperger | G02B 5/201 348/273 |
| 6,610,997 | B2 * | 8/2003 | Murade | H01L 29/78609 257/306 |
| 6,686,249 | B1 * | 2/2004 | Yukinobu | C03C 17/3411 252/514 |
| 7,259,806 | B1 | 8/2007 | Lee et al. | |
| 9,268,168 | B2 | 2/2016 | Yi et al. | |
| 9,274,390 | B2 | 3/2016 | Chang et al. | |
| 2011/0157534 | A1 * | 6/2011 | Hong | G02F 1/134363 349/141 |
| 2011/0199684 | A1 * | 8/2011 | Hashimoto | G02B 5/201 359/586 |
| 2011/0212392 | A1 * | 9/2011 | Iwashita | G03F 1/54 430/5 |
| 2012/0097930 | A1 * | 4/2012 | Park | H01L 51/5284 257/40 |
| 2013/0057801 | A1 | 3/2013 | Park et al. | |
| 2013/0155356 | A1 | 6/2013 | Jang et al. | |
| 2013/0207087 | A1 * | 8/2013 | Kim | H01L 27/3225 257/40 |
| 2013/0222723 | A1 * | 8/2013 | Kim | H01L 33/58 349/40 |
| 2014/0251429 | A1 | 9/2014 | Lim et al. | |
| 2015/0223326 | A1 * | 8/2015 | Lim | H05K 3/16 345/174 |
| 2015/0253899 | A1 | 9/2015 | Yang et al. | |
| 2018/0172881 | A1 | 6/2018 | Zhang et al. | |

FOREIGN PATENT DOCUMENTS

| | | |
|---|---|---|
| CN | 104730603 | 6/2015 |
| JP | 2013-125277 | 6/2013 |
| KR | 10-20040011161 | 2/2004 |
| KR | 10-2006-0001248 | 1/2006 |
| KR | 10-0820104 | 4/2008 |
| KR | 10-2008-0099437 | 11/2008 |
| KR | 10-2009-0061470 | 6/2009 |
| KR | 10-1306563 | 9/2013 |
| KR | 10-2015-0057850 | 5/2015 |
| KR | 10-2015-0065526 | 6/2015 |

* cited by examiner

[Figure 1]
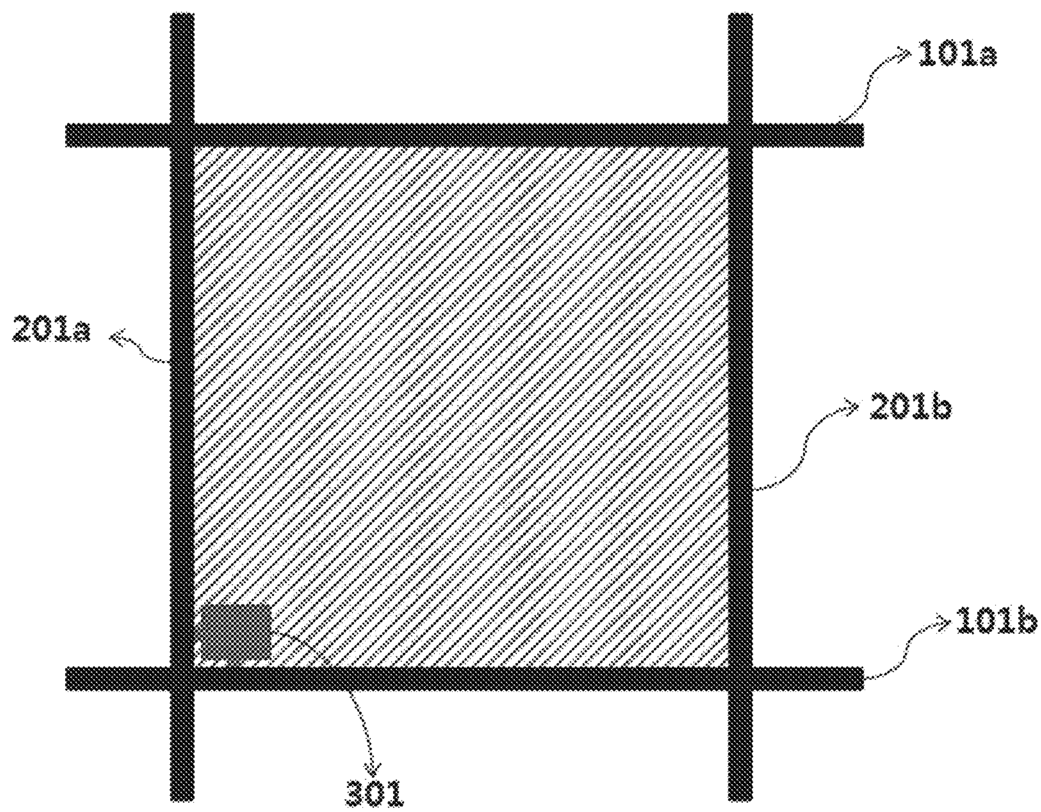
[Figure 2]
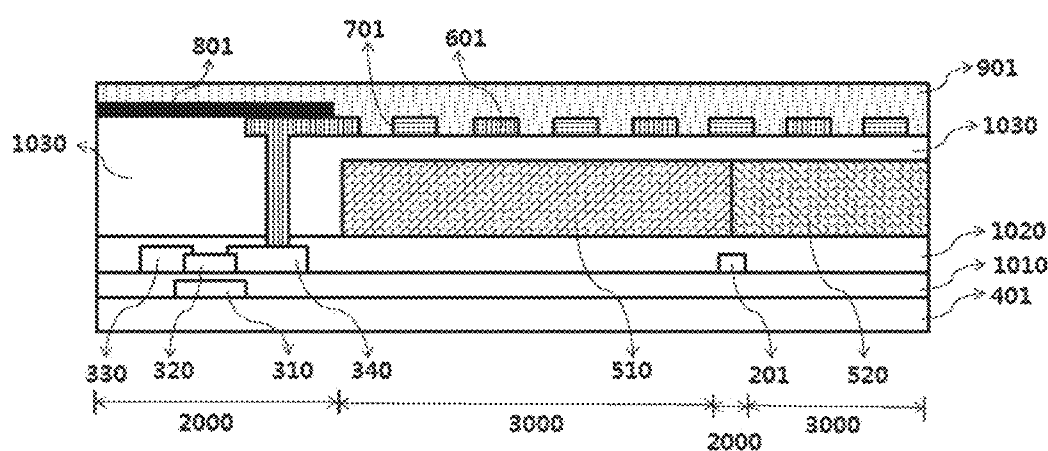

[Figure 3]
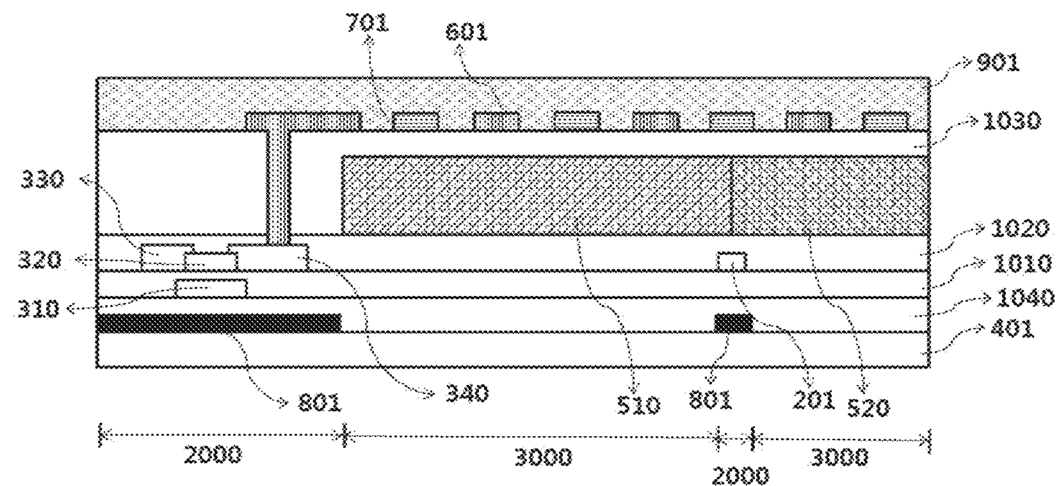
[Figure 4]
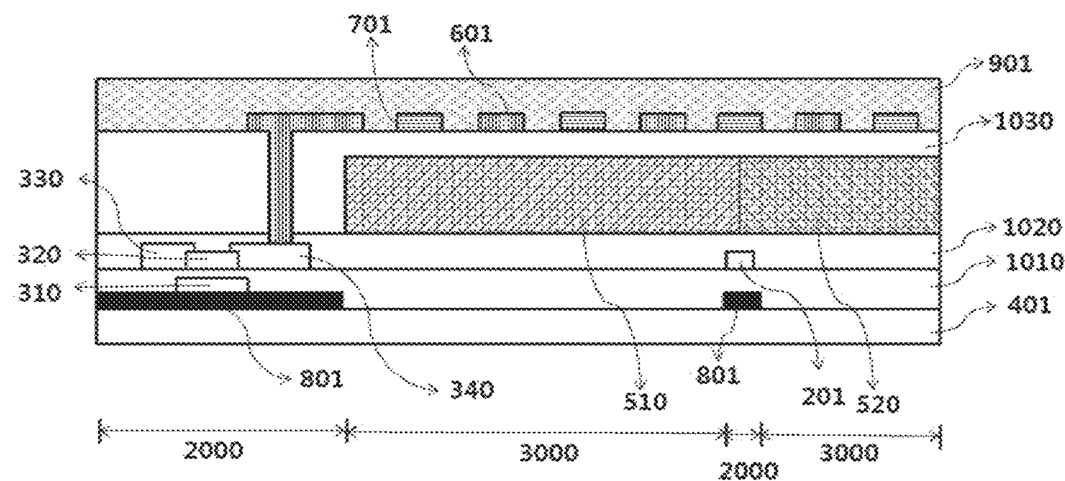

[Figure 5]
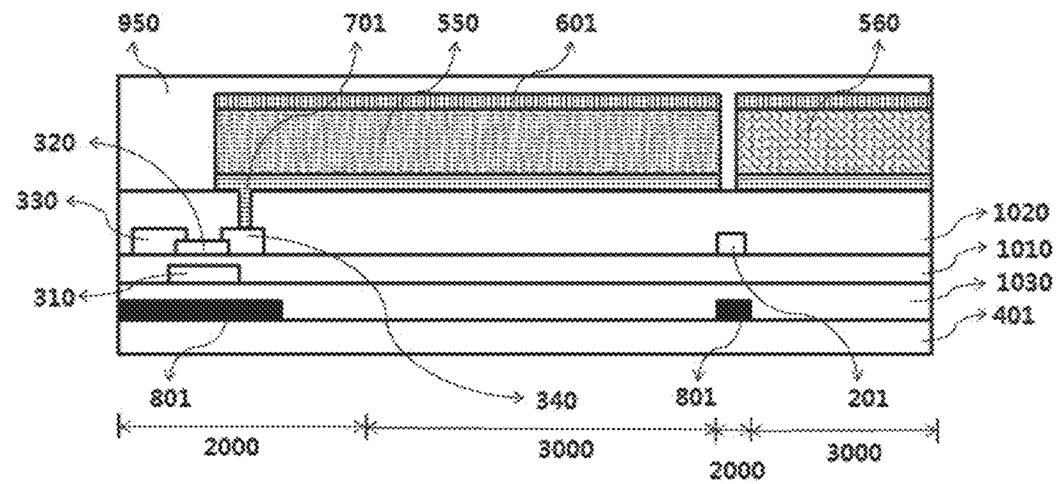
[Figure 6]
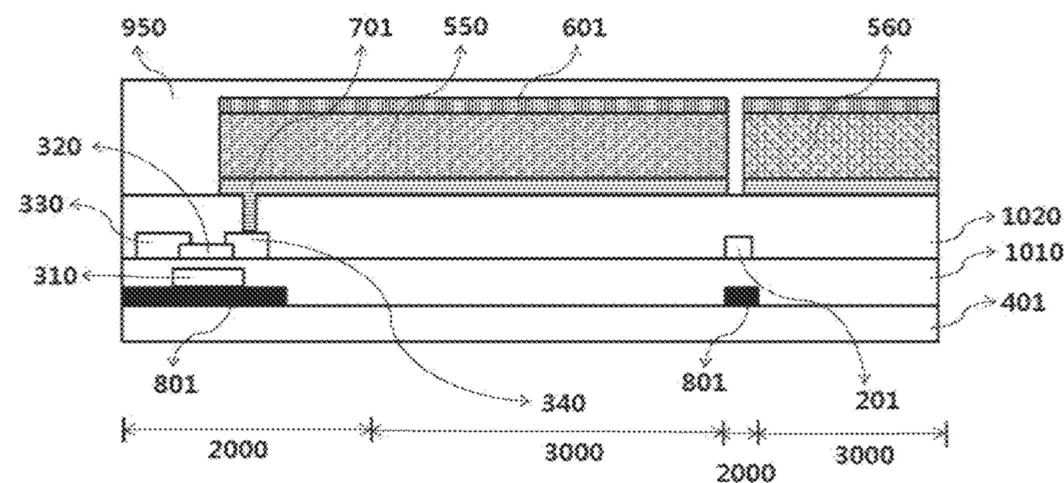

[Figure 7]
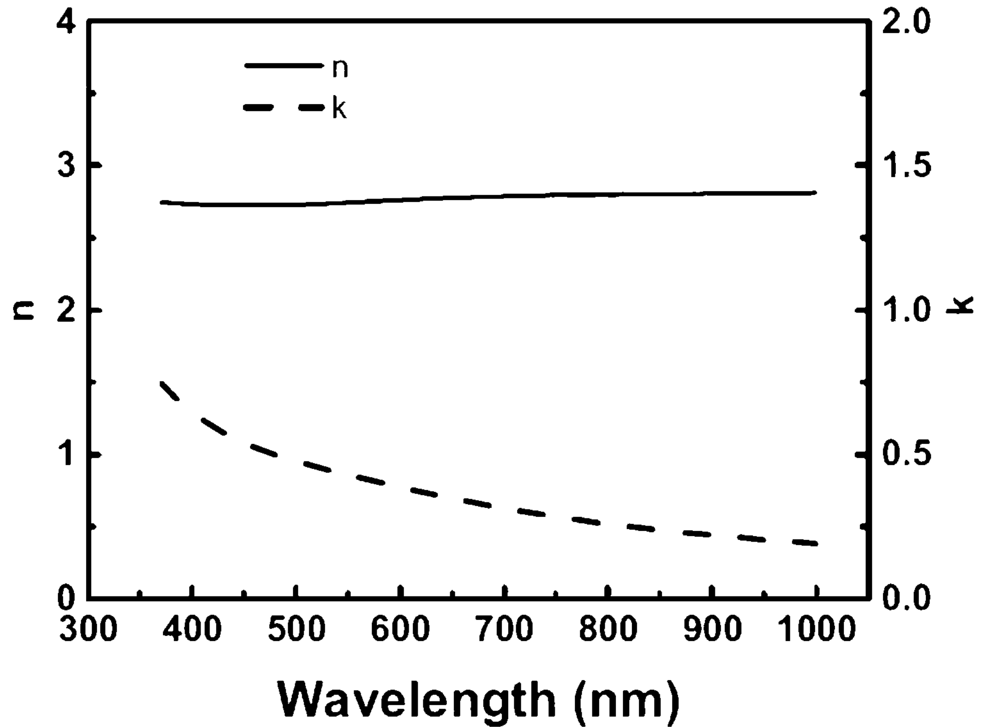
[Figure 8]
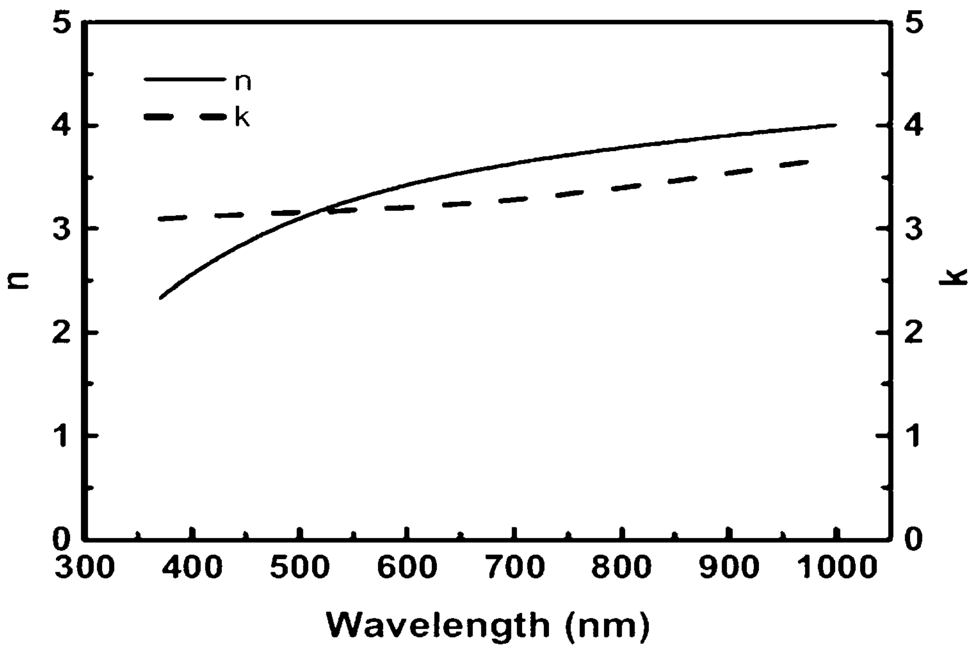

[Figure 9]
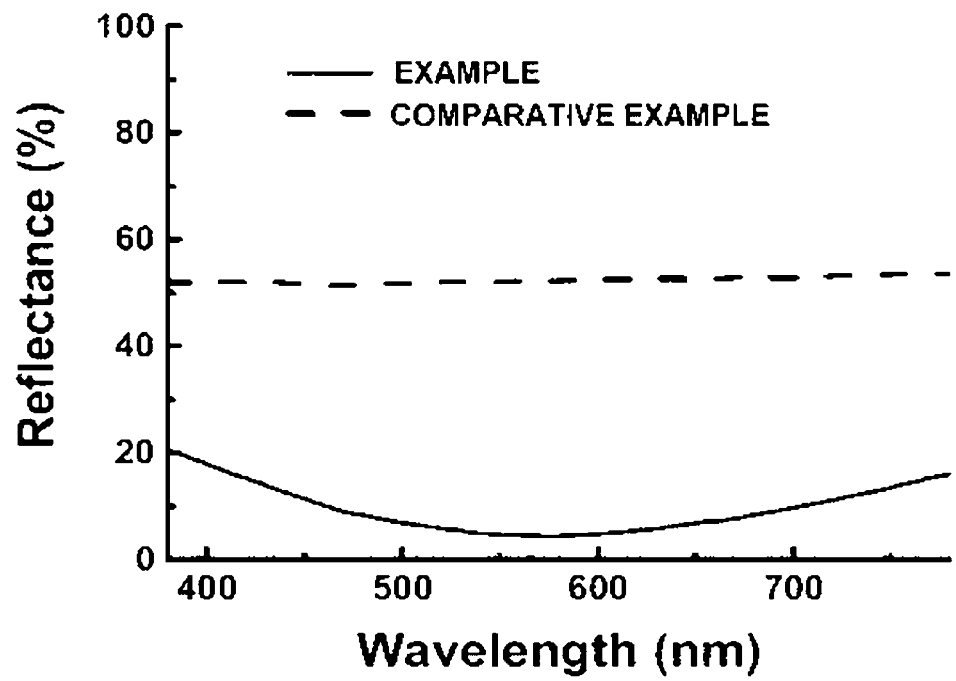
[Figure 10]
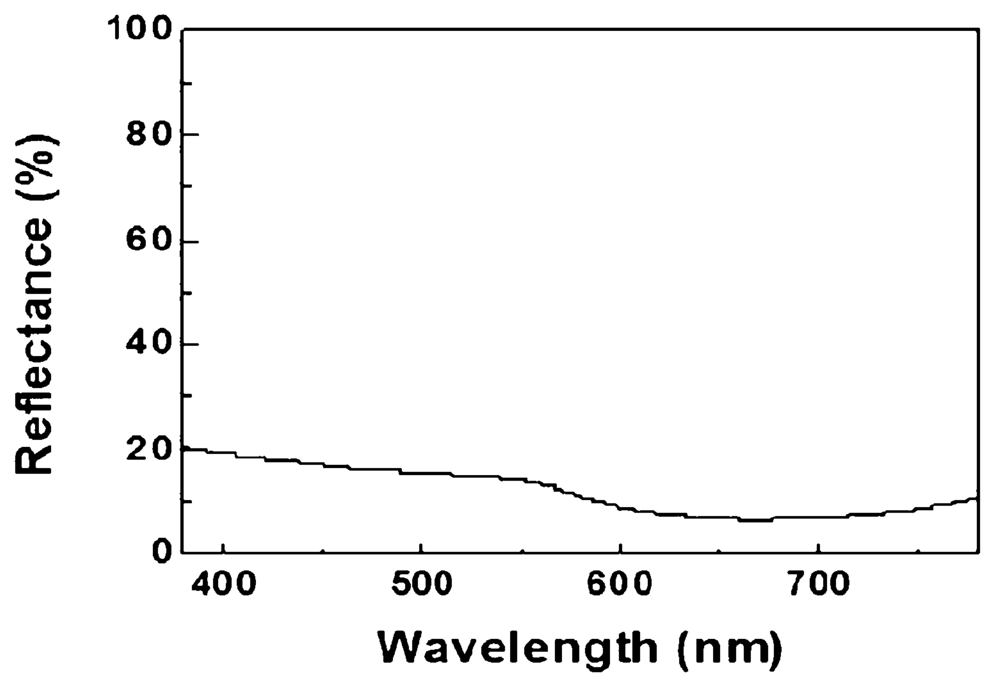

[Figure 11]
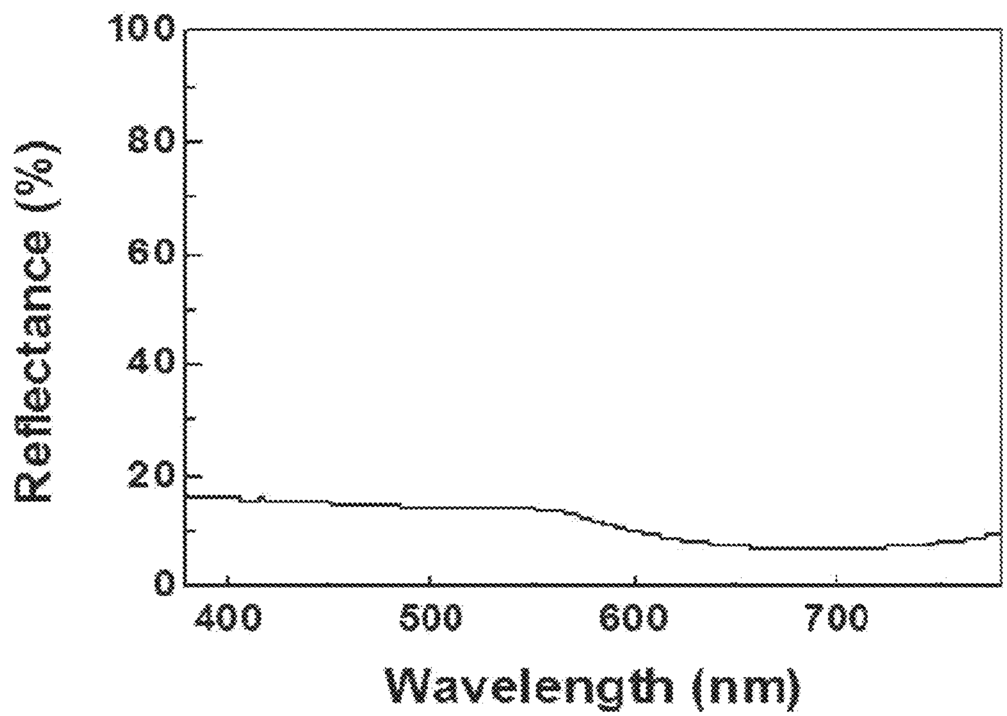
[Figure 12]
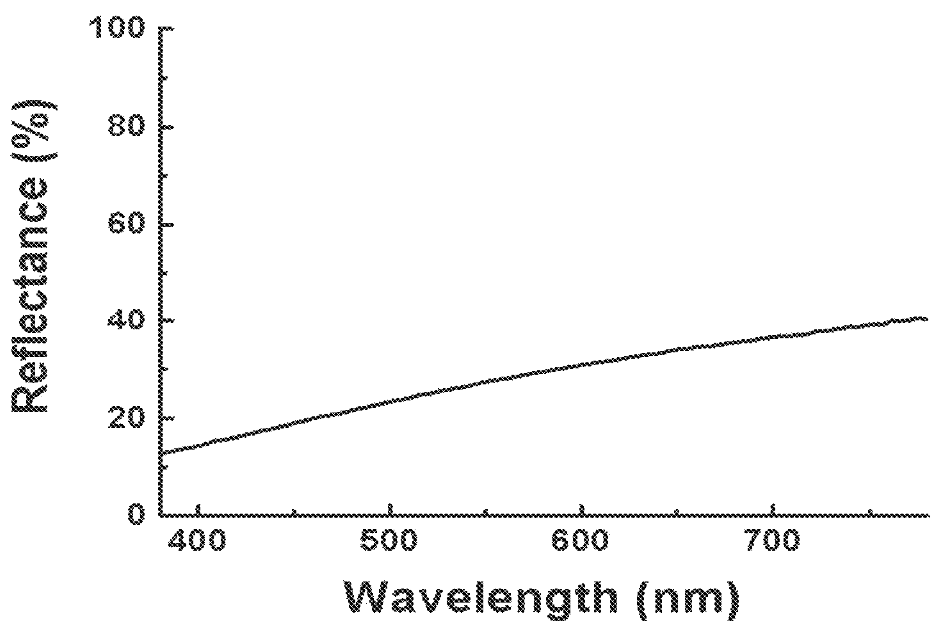

[Figure 13]
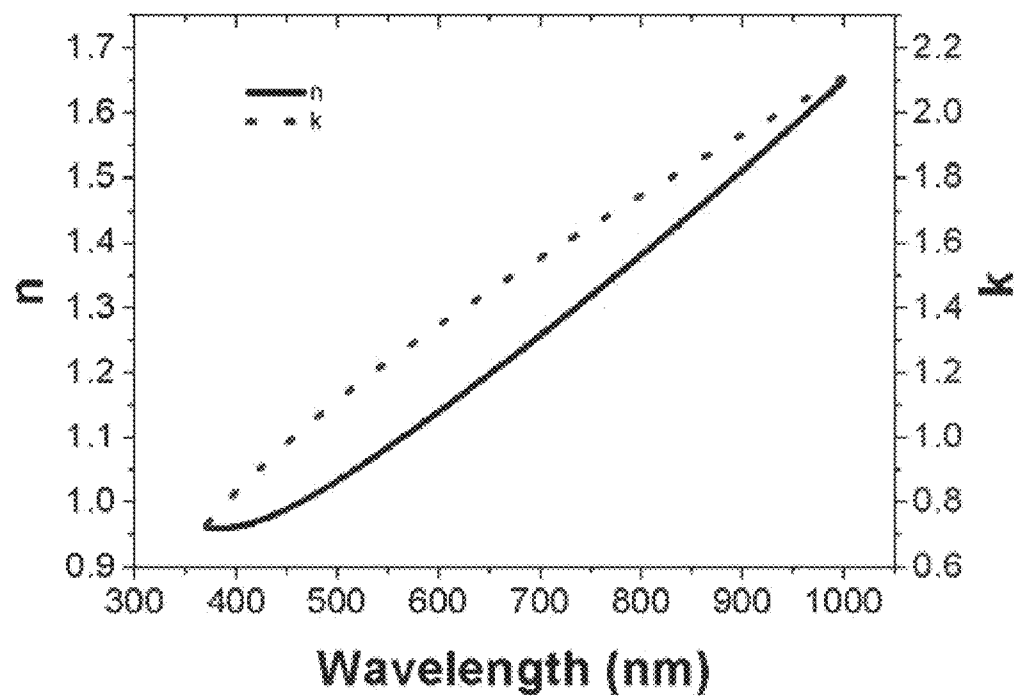

DISPLAY DEVICE

TECHNICAL FIELD

This application is a National Stage Application of International Application No. PCT/KR2016/011162 filed on Oct. 6, 2016, which claims priority to and the benefit of Korean Patent Application No. 10-2015-0140574, filed with the Korean Intellectual Property Office on Oct. 6, 2015, both of which are incorporated herein in their entirety by reference for all purposes as if fully set forth herein.

BACKGROUND ART

In general, a lattice type black pattern, which is called a black matrix, is disposed between color pixels of a color filter for the purpose of improving contrast. In a known black matrix, a method for forming a pattern by depositing chrome (Cr) as a pigment on an entire glass substrate and etching the glass substrate is used, but high cost is required in a process, and a problem of high reflectivity of chrome and a problem of environmental pollution due to chrome waste liquid occur.

By the reason, research on a black matrix, of which a fine process is available, has been actively conducted, and research for preparing a black composition as a coloring pigment, other than carbon black, has also been conducted, but the coloring pigment other than the carbon black has a weak light blocking property, so that the quantity of coloring pigment mixed needs to be extremely increased, and as a result, there is a problem in that viscosity of the composition is increased, so that it may be difficult to treat the coloring pigment, or strength of the formed layer or adhesiveness to the substrate is considerably degraded.

Further, as a size of the screen of a display device is increased, a problem in brightness occurs, such that a lighter backlight is adopted. Since brightness of the backlight is increased, it is required that the black matrix has a higher light blocking property as compared to the known black matrix.

DETAILED DESCRIPTION OF THE INVENTION

Technical Problem

The present specification relates to a display device including a black matrix, which is capable of effectively controlling a glaring phenomenon in a non-pixel area.

Technical Solution

An exemplary embodiment of the present specification provides a display device including: a substrate including a pixel area and a non-pixel area; a black matrix provided in at least a part of the non-pixel area of the substrate; and a pixel electrode provided in the pixel area of the substrate and a common electrode corresponding to the pixel electrode, in which the pixel area is divided by a plurality of gate lines and a plurality of data lines, which are provided on the substrate while crossing each other, the non-pixel area includes a wiring unit including a thin film transistor, and the gate line and the data line, and the black matrix satisfies a value of 0.004 or more and 0.22 or less of Equation 1 below.

$$\frac{(k \times t)}{\lambda} \quad \text{[Equation 1]}$$

In Equation 1, k means an extinction coefficient of the black matrix, t means a thickness of the black matrix, and λ means a wavelength of light.

Advantageous Effects

According to the display device according to the present specification, it is possible to implement a display having a high image quality by controlling light reflectance by the wiring unit in the non-pixel area.

BRIEF DESCRIPTION OF DRAWINGS

FIG. 1 illustrates an example of one pixel area of the present specification.

FIG. 2 illustrates a cross-section of a liquid crystal display device according to an exemplary embodiment of the present specification.

FIG. 3 illustrates a cross-section of a liquid crystal display device according to an exemplary embodiment of the present specification.

FIG. 4 illustrates a cross-section of a liquid crystal display device according to an exemplary embodiment of the present specification.

FIG. 5 illustrates a cross-section of an organic light emitting display device according to an exemplary embodiment of the present specification.

FIG. 6 illustrates a cross-section of an organic light emitting display device according to an exemplary embodiment of the present specification.

FIG. 7 is a graph representing values of n and k according to a wavelength in a light reflection decreasing layer in Example 1.

FIG. 8 is a graph representing values of n and k according to a wavelength in a MoTi layer in Comparative Example 1.

FIG. 9 represents a comparison of reflectance between Example 1 and Comparative Example 1.

FIG. 10 represents reflectance of Example 13.

FIG. 11 represents reflectance of Example 14.

FIGS. 12 and 13 represent values of reflectance and an optical constant implemented by a structure manufactured in Example 15.

EXPLANATION OF REFERENCE NUMERALS AND SYMBOLS

101*a*, 101*b*: Gate line
201, 201*a*, 201*b*: Data line
301: Thin film transistor
310: Gate electrode
320: Semiconductor layer
330: Source electrode
340: Drain electrode
401: Substrate
510, 520: Color filter layer
550, 560: Organic material layer
601: Common electrode
701: Pixel electrode
801: Black matrix
901: Liquid crystal orientation layer
950: Partition wall
1010, 1020, 1030, 1040: Insulating layer
2000: Non-pixel area
3000: Pixel area

BEST MODE

In the present specification, when it is said that a specific member is positioned "on" the other member, this includes a case where another member is present between two members, as well as a case where the specific member is in contact with the other member.

In the specification, unless explicitly described to the contrary, when it is said that a specific part "comprises" a specific constituent element, this means that another constituent element may be further included, not that another constituent element is excluded.

Hereinafter, the present specification will be described in more detail.

In the present specification, a display device is a term collectively referring to a TV, a computer monitor, or the like, and includes a display device that forms an image, and a case that supports the display device.

The present inventors developed the display device, which will be described below, as a result of the repeated research for obtaining performance of a black matrix and enabling the black matrix to be finely patterned for preventing light reflection, a light leakage phenomenon in a non-pixel area, and the like. Particularly, the present inventors found that when a black matrix satisfies Equation 1 below, the black matrix exhibits excellent light reflection decreasing performance, and further, when a black matrix is formed by using a metal oxide, a metal nitride, and a metal oxynitride, it is possible to simplify a process and secure reliability of patterning.

An exemplary embodiment of the present specification provides a display device including: a substrate including a pixel area and a non-pixel area; a black matrix provided in at least a part of the non-pixel area of the substrate; and a pixel electrode provided in the pixel area of the substrate and a common electrode corresponding to the pixel electrode, in which the pixel area is divided by a plurality of gate lines and a plurality of data lines, which are provided on the substrate while crossing each other, the non-pixel area includes a wiring unit including a thin film transistor, and the gate line and the data line, and the black matrix satisfies a value of 0.004 or more and 0.22 or less of Equation 1 below.

$$\frac{(k \times t)}{\lambda} \quad \text{[Equation 1]}$$

In Equation 1, k means an extinction coefficient of the blade matrix, t means a thickness of the black matrix, and λ means a wavelength of light.

The black matrix may be provided on an emission surface layer of the display device, and may serve to prevent light from being reflected from a surface of a wire electrode of the wiring unit including the thin film transistor and the gate line and the data line provided in the non-pixel area.

When external light is incident into the black matrix, first reflected light, which is reflected from a surface of the black matrix, exists, and second reflected light, which passes through the black matrix and is reflected from the wiring unit in the lower portion of the black matrix, exists.

FIG. 1 illustrates an example of one pixel area of the present specification. Particularly, FIG. 1 represents a pixel area divided by a plurality of gate lines 101*a* and 101*b* and a plurality of data lines 201*a* and 201*b* provided on a substrate with a deviant crease line area. Further, a thin film transistor 301 electrically connected to the gate line 101*b* and the data line 201*a* is provided within the pixel area to control an electric signal of each pixel area.

The black matrix may decrease light reflectance through destructive interference between the first reflected light and the second reflected light.

The present inventors found that when the black matrix, which satisfies a value of 0.004 or more and 0.22 or less of Equation 1, is provided in a non-pixel area, it is possible to implement high resolution of the display by remarkably decreasing light reflectance by the wiring unit under the black matrix through the destructive interference.

Particularly, a condition, under which the first reflected light and the second light reflected have a phase difference of 180° and thus destructively interfere, is expressed by Equation 2 below.

$$t = \frac{\lambda}{4 \cdot n} \times N \quad \text{[Equation 2]}$$

In Equation 2, t means a thickness of the black matrix, λ means a wavelength of light, n means a refractive index of the black matrix, and N means a predetermined odd number, such as 1, 3, and 5.

First reflectance under the destructive interference condition may be obtained by Equation 3 below.

$$R_1 = \left[\frac{(n-1)^2 + k^2}{(n+1)^2 + k^2}\right] \quad \text{[Equation 3]}$$

In Equation 3, n means a refractive index of the black matrix, and k means an extinction coefficient of the black matrix.

Further, second reflectance under the destructive interference condition may be obtained by Equation 4 below.

$$R_2 = R_{metal}(1 - R_1) I_0 \exp\left(-\frac{2\pi}{n} \cdot k \cdot N\right) \quad \text{[Equation 4]}$$

In Equation 4, $R_{metal}$ means reflectance of a surface of a wiring electrode of the wiring unit under the black matrix, $R_1$ means first reflectance of the black matrix, $I_0$ means intensity of incident light, n means a refractive index of the black matrix, k means an extinction coefficient of the black matrix, and N means a predetermined odd number, such as 1, 3, and 5.

According to the exemplary embodiment of the present specification, an absolute value of a difference between the first reflectance and the second reflectance may be 0.13 or more and 0.42 or less.

According to the exemplary embodiment of the present specification, λ may be 550 nm. That is, light may have a wavelength of 550 nm.

According to the exemplary embodiment of the present specification, the display device may further include a metal layer provided while being in contact with the lower portion of the black matrix.

The lower portion of the black matrix may mean an opposite surface of a surface recognized as a screen.

According to the exemplary embodiment of the present specification, the metal layer may include one or two or more metals selected from the group consisting of Cu, Al, Mo, Ti, Ag, Ni, Mn, Au, Cr, and Co.

According to the exemplary embodiment of the present specification, a thickness of the metal layer may be 10 nm or more 1 μm or less.

When external light is incident into the black matrix, first reflected light, which is reflected from a surface of the black matrix, exists, and second reflected light, which passes through the black matrix and is reflected from the metal layer in the lower portion of the black matrix, exists. The metal layer may serve to decrease light reflectance on the surface of the black matrix through the destructive interference between the first reflected light and the second reflected light.

According to the exemplary embodiment of the present specification, a thickness of the black matrix may be 10 nm or more and 100 nm or less.

According to the exemplary embodiment of the present specification, a thickness of the black matrix may be 10 nm or more and 100 nm or less. Particularly, according to the exemplary embodiment of the present specification, a thickness of the black matrix may be 20 nm or more and 60 nm or less.

When a thickness of the black matrix is less than 10 nm, there may occur a problem in that light reflectance of the wiring unit provided in the non-pixel area may not be sufficiently controlled. Further, when a thickness of the black matrix is more than 100 nm, there may occur a problem in that it is difficult to pattern the black matrix.

According to the exemplary embodiment of the present specification, an extinction coefficient k of the black matrix may be 0.1 or more and 2 or less in light having a wavelength of 550 nm. Particularly, according to the exemplary embodiment of the present specification, an extinction coefficient k of the black matrix may be 0.4 or more and 2 or less in light having a wavelength of 550 nm.

When the extinction coefficient is within the range, it is possible to effectively control light reflectance of the wiring unit provided in the non-pixel area, thereby further improving visibility of the liquid crystal display device.

The extinction coefficient may be measured by using the Ellipsometer measurement equipment, which is well-known in the art.

The extinction coefficient k may also be called an absorption coefficient, and is an index defining how strong a target material absorbs light at a predetermined wavelength. Accordingly the incident light passes through the black matrix having the thickness t and is firstly absorbed according to the degree of extinction coefficient k, and the light reflected by the electrode layer in the lower portion of the black matrix passes through the black matrix having the thickness t again and is secondarily absorbed, and then is externally reflected. Accordingly, the thickness of the black matrix and the value of the absorption coefficient act as the important factors influencing the entire reflectance. Accordingly, according to the exemplary embodiment of the present specification, an area, in which light reflection may be decreased within a predetermined range of the absorption coefficient k and the thickness t of the black matrix, is represented through Equation 1.

According to the exemplary embodiment of the present specification, a refractive index n of the black matrix may be 2 or more and 3 or less in light having a wavelength of 550 nm.

The first reflection occurs incurred in a material of the black matrix having the refractive index n together with the extinction coefficient k, and in this case, the main factors determining the first reflection are the refractive index n and the absorption coefficient k. Accordingly, the refractive index n and the absorption coefficient k are closely related to each other, and the effect of the light reflection decreasing layer may be maximized within the range.

According to the exemplary embodiment of the present specification, light reflectance in the surface of the black matrix may be 40% or less.

According to the exemplary embodiment of the present specification, the black matrix may include one or more selected from the group consisting of a metal oxide, a metal nitride, and a metal oxynitride. Particularly, according to the exemplary embodiment of the present specification, the black matrix may include one or more selected from the group consisting of a metal oxide, a metal nitride, and a metal oxynitride as a main material.

According to the exemplary embodiment of the present specification, the metal oxide, the metal nitride, and the metal oxynitride may be derived from one or two or more metals selected from the group consisting of Cu, Al, Mo, Ag, Ni, Mn, Au, Cr, and Co.

According to the exemplary embodiment of the present specification, the black matrix may include a material selected from the group consisting of a copper oxide, a copper nitride, and a copper oxynitride.

According to the exemplary embodiment of the present specification, the black matrix may include a material selected from the group consisting of an aluminum oxide, an aluminum nitride, and an aluminum oxynitride.

According to the exemplary embodiment of the present specification, the black matrix may include a copper-manganese oxide.

According to the exemplary embodiment of the present specification, the black matrix may include a copper-manganese oxynitride.

According to the exemplary embodiment of the present specification, the black matrix may include a copper-nickel oxide.

According to the exemplary embodiment of the present specification, the black matrix may include a copper-nickel oxynitride.

According to the exemplary embodiment of the present specification, the black matrix may include a molybdenum-titanium oxide.

According to the exemplary embodiment of the present specification, the black matrix may include a molybdenum-titanium oxynitride.

According to the exemplary embodiment of the present specification, the black matrix may be formed in a single layer, and may also be formed of two or more layers. The black matrix may have an achromatic color, but the color thereof is not particularly limited thereto. In this case, the color in the achromatic color series means a color that does not selectively absorb light incident to a surface of an object and appears when the light is evenly reflected and absorbed with respect to a wavelength of each component.

According to the exemplary embodiment of the present specification, the pixel electrode and the common electrode may include one or two or more metals selected from the group consisting of Cu, Al, Mo, Ti, Ag, Ni, Mn, Au, Cr, and Co.

According to the exemplary embodiment of the present specification, the non-pixel area may include the wiring unit including the gate line and the data line, and may include an insulating layer between the wiring unit and the black matrix.

According to the exemplary embodiment of the present specification, the black matrix may be provided to be closer to the substrate than the wiring unit.

According to the exemplary embodiment of the present specification, the black matrix may be provided to be farther from the substrate than the wiring unit.

According to the exemplary embodiment of the present specification, the black matrix may be provided on the non-pixel area of the substrate, and at least a part of the wiring unit may be provided on the black matrix. Particularly, according to the exemplary embodiment of the present specification, the wiring unit may be provided on the black matrix, and a screen may be viewed through the substrate. An example of the structure is illustrated in FIGS. 3 to 6. In this case, there is an advantage in that it is not necessary to additionally form a cover part in a bezel area of the display device. That is, the black matrix may serve as an existing cover part of a bezel area, and thus it is possible to remove a step according to the cover part of the bezel area.

According to the exemplary embodiment of the present specification, the thin film transistor connected to each of the gate line and the data line is included at one side of each pixel area.

According to the exemplary embodiment of the present specification, the thin film transistor includes a gate electrode branched from the gate line and a semiconductor layer provided on the gate electrode with an insulating layer interposed therebetween. Further, the semiconductor layer is connected with a source electrode and a drain electrode with an ohmic contact layer interposed therebetween, and the source electrode is connected with the data line.

The gate line supplies a scan signal from a gate driver, and the data line supplies a video signal from a data driver.

According to the exemplary embodiment of the present specification, the display device may be a liquid crystal display device, which includes a color filter layer in each pixel area, and includes the pixel electrode and the common electrode provided on the same plane as that of the color filter layer.

FIG. 2 illustrates a cross-section of a liquid crystal display device according to an exemplary embodiment of the present specification. Particularly, a thin film transistor 301 formed of a gate electrode 310, a semiconductor layer 320, a source electrode 330, and a drain electrode 340 is provided on a substrate, a pixel area connected to a gate electrode is divided by a gate line (not illustrated) connected to a gate electrode and a data line 201, color filter layers 510 and 520 are provided within the pixel area, and a common electrode 601 and a pixel electrode 701 are provided side by side on the color filter layers 510 and 520 within each pixel area. Further, the substrate may be divided into a non-pixel area 2000 and a pixel area 3000, a black matrix 801 is provided in the non-pixel area, and then a liquid crystal orientation layer 901 is provided. FIG. 2 does not illustrate a liquid crystal layer provided on the liquid crystal orientation layer 901. However, the liquid crystal display device according to the exemplary embodiment of the present specification may be applied in various structures, other than the structure illustrated in FIG. 2.

Further, unlike the liquid crystal display device having the structure of FIG. 2, in a case of a liquid crystal display device having a reversed structure, that is, a structure, in which a screen of a pixel unit is viewed through a substrate, a black matrix needs to be provided to be closer to the substrate than a wiring unit. In this case, after the black matrix is formed, a process of forming a thin film transistor and the like needs to be performed at a high temperature condition, so that it is difficult to use an organic material as the black matrix. In this respect, the black matrix according to the present specification does not use an organic material, so that it is possible to secure stability at a high temperature.

FIG. 3 illustrates a cross-section of a liquid crystal display device according to an exemplary embodiment of the present specification. Particularly, FIG. 3 exemplifies an example of a liquid crystal display device having a reversed structure according to an exemplary embodiment of the present specification, and a position of a black matrix is different from that of the case of FIG. 2. That is, according to FIG. 3, a black matrix 801 is formed on a substrate, an insulating layer 1040 is formed thereon, then a thin film transistor 301 formed of a gate electrode 310, a semiconductor layer 320, a source electrode 330, and a drain electrode 340 is provided on an insulating layer, a pixel area is divided by a gate line (not illustrated) connected to a gate electrode and a data line 201, color filter layers 510 and 520 are provided within the pixel area, a common electrode 601 and a pixel electrode 701 are provided side by side on the color filter layers 510 and 520 within each pixel area, and a liquid crystal orientation layer 901 is provided. Further, the substrate may be divided into a non-pixel area 2000 and a pixel area 3000. However, the liquid crystal display device according to the exemplary embodiment of the present specification may be applied in various structures, other than the structure illustrated in FIG. 3.

Further, in the structure of the case of FIG. 3, the insulating layer 1040 provided after the black matrix is formed may be excluded, and a wiring unit may also be formed. An example of the structure is illustrated in FIG. 4. Particularly, FIG. 4 represents a case where a gate electrode 301 is directly formed on a black matrix 801 in the structure of FIG. 3.

In the liquid crystal display devices having the reversed structures of FIGS. 3 and 4, there is an advantage in that a cover part for hiding an electrode pad part, which is required in the structure of FIG. 2, may not be provided. Particularly, in the liquid crystal display device having the structure illustrated in FIG. 3, it is possible to block light reflection of the wiring unit through the black matrix, so that a cover part for blocking light reflection in the bezel area may not be added.

In the liquid crystal display device according to the exemplary embodiment of the present specification, each of the pixel electrode and the common electrode includes a plurality of conductive lines, and the pixel electrode and the common electrode within the pixel area may be provide in parallel. Particularly, the pixel electrode and the common electrode may be alternately provided within each pixel area. Accordingly, liquid crystal molecules may be driven by forming a horizontal electric field within each pixel area.

In the liquid crystal display device according to the exemplary embodiment of the present specification, the common electrode receives a common voltage that is a reference voltage for driving liquid crystal, and thus a horizontal electric field is formed between the pixel electrode, to which a pixel voltage signal is supplied, and the common electrode, to which a common voltage is supplied, so that liquid crystal molecules arranged in a horizontal direction are rotated by dielectric anisotropy. Further, light transmittance of light passing through the pixel area is varied according to the degree of rotation of the liquid crystal molecules, so that an image may be implemented.

In the liquid crystal display device according to the exemplary embodiment of the present specification, at least one of the pixel electrode and the common electrode may be provided on an overlapping portion of the color filter layer.

The overlapping portion of the color filter layer may mean an area, in which the color filters having different colors are in contact with each other, and may mean an area, in which the different color filter layers 510 and 520 are in contact with each other in FIG. 2.

When the pixel electrode or the common electrode is provided on the overlapping portion of the color filter layer, there is an advantage in that it is possible to prevent colors from being mixed in the overlapping portion of the color filter layer when the display is driven.

The color filter layer provided in each pixel area may be a red, green, or blue color filter layer. Further, depending on a case, a white color filter layer may be provided within any one pixel area. Each of the red color filter layer, the green color filter layer, the blue color filter layer, and the white color filter layer may form one unit pixel, and the one unit pixel may display an image through light of a color, which passes through the red color filter layer, the green color filter layer, and the blue color filter layer and is emitted.

The display device according to the exemplary embodiment of the present specification may be an organic light emitting display device, which includes an organic material layer on each pixel area, the organic material layer being provided between the pixel electrode and the common electrode.

FIG. 5 illustrates a cross-section of an organic light emitting display device according to an exemplary embodiment of the present specification. Particularly, a thin film transistor 301 formed of a gate electrode 310, a semiconductor layer 320, a source electrode 330, and a drain electrode 340 is provided on a substrate 401, a pixel area is divided by a gate line (not illustrated) connected to a gate electrode 310 and a data line 201, and organic light emitting devices, each of which includes a pixel electrode 701, organic material layers 550 and 560, and a common electrode 601, are provided within the pixel area, and the respective organic light emitting devices are spaced apart from one another by partition walls 901. Further, the gate electrode 310 and a semiconductor layer 320 may be insulated by an insulating layer 1010. The insulating layer 1010 may be a gate insulating layer. Further, the substrate may be divided into a non-pixel area 2000 and a pixel area 3000, a black matrix 801 is provided in the non-pixel area, the insulating layer 1030 is formed, and then the thin film transistor is formed. However, the organic light emitting display device according to the exemplary embodiment of the present specification may be applied in various structures, other than the structure illustrated in FIG. 5.

Further, in the structure of the case of FIG. 5, the insulating layer 1030 provided after the black matrix is formed may be excluded, and a wiring unit may also be formed. An example of the structure is illustrated in FIG. 6. Particularly, FIG. 6 represents a case where a gate electrode 301 is directly formed on a black matrix 801 in the structure of FIG. 5.

In the organic light emitting display device according to the exemplary embodiment of the present disclosure, the pixel electrode may be a transparent electrode.

In the organic light emitting display device according to the exemplary embodiment of the present disclosure, the organic material layer may include one or more emission layers, and may further include one or two or more selected from the group consisting of a hole injection layer, a hole transporting layer, a hole blocking layer, a charge generating layer, an electron blocking layer, an electron transporting layer, and an electron injection layer.

The charge generating layer refers to a layer, in which holes and electrons are generated when a voltage is applied.

In the organic light emitting display device according to the exemplary embodiment of the present disclosure, the pixel electrode may be an anode, and the common electrode may be a cathode. Further, the pixel electrode may be a cathode, and the common electrode may be an anode.

A material having a high work function so as to facilitate the injection of holes into the organic material layer may be generally a material of the anode. Particular examples of the anode material usable used in the present invention include a metal, such as vanadium, chrome, copper, zinc, and gold or an alloy thereof, a metal oxide, such as a zinc oxide, an indium oxide, an indium tin oxide (ITO), and an indium zinc oxide (IZO), a combination of a metal and an oxide, such as ZnO:Al or $SnO_2$:Sb, and a conductive polymer, such as poly(3-methylthiophene), poly[3,4-(ethylene-1,2-dioxy)thiophene] (PEDT), polypyrrole and polyaniline, but the anode material is not limited thereto.

The material of the anode is not limited only to the anode, and may be used as a material of the cathode.

A material having a low work function so as to facilitate the injection of electrons into the organic material layer may be generally a material of the cathode. Particulars examples of the material of the cathode include a metal, such as magnesium, calcium, sodium, potassium, titanium, indium, yttrium, lithium, gadolinium, aluminum, silver, tin and lead, or an alloy thereof, a multi-layer structured material, such as LiF/Al or $LiO_2$/Al, but the cathode material is not limited thereto.

The material of the cathode is not limited only to the cathode, and may be used as a material of the anode.

A material, which is capable of receiving holes from the anode or the hole injection layer and transferring the received holes to an emission layer, and has high mobility for holes, is suitable as a material of the hole transporting layer according to the present specification. Particular examples of the material of the hole transporting layer include an arylamine-based organic materials, a conductive polymer, a block copolymer having both a conjugated portion and a non-conjugated portion, and the like, but the material of the hole transporting layer is not limited thereto.

A material, which is capable of emitting light in a visible light region by receiving holes and electrons from the hole transporting layer and the electron transporting layer, respectively, and combining the received holes and electrons, and has high quantum efficiency for fluorescence and phosphorescence may be the material of the emission layer according to the present specification. Particular examples of the material of the emission layer include 8-hydroxy-quinoline-aluminum complex ($Alq_3$), carbazole-based compounds, dimerized styryl compounds, BAlq; 10-hydroxy-benzoquinoline-metal compounds, benzoxazole-based, benzthiazole-based and benzimidazole-based compounds, poly(p-phenylenevinylene) (PPV)-based polymers, spiro compounds, polyfluorene, rubrene, and the like, but the material of the emission layer is not limited thereto.

A material, which is capable of receiving electrons injected from the cathode and transferring the injected electrons to the emission layer, and has high mobility for the electrons, is suitable as the material of the electron transporting layer. Particular examples of the material of the electron transporting layer include a 8-hydroxyquinoline Al complex; a complex including $Alq_3$; an organic radical compound; a hydroxyflavone metal complex and the like, but are not limited thereto.

MODE FOR CARRYING OUT THE INVENTION

Hereinafter, the present invention will be described in detail with reference to the Examples. However, the following Examples are set forth to illustrate the present invention, but do not intend to limit the scope of the present invention.

Example 1

A MoTi layer having a thickness of 30 nm was formed by a sputtering method by using a MoTi (50:50 at %) alloy target on a glass substrate, and a MoTi oxynitride layer having a thickness of 40 nm was formed by a reactive sputtering method by using a MoTi (50:50 at %) target on the MoTi layer. Reflectance of the deposited layer was 9.4%.

In order to obtain a value of a light absorption coefficient k, a MoTi oxynitride single layer was formed on the glass substrate by the same method. Then, a refractive index and a light absorption coefficient were measured by using the ellipsometer. Values of n and k at a wavelength of 380 to 1,000 nm are represented in FIG. 7, and a light absorption coefficient value at a wavelength of 550 nm is 0.43. A value of Equation 1 was calculated as 0.031.

Examples 2 to 12

In the cases of Examples 2 to 12, an optical simulation was performed through the MacLeod program. A value of reflectance in a case where a MoTi oxynitride layer has each thickness was obtained by substituting an optical constant value of Example 1 to the program, and the values are represented in Table 1 below.

TABLE 1

| | Thickness of MoTi oxynitride layer (nm) | Value of Equation 1 | Reflectance (%) |
|---|---|---|---|
| Example 2 | 5.5 | 0.0043 | 52 |
| Example 3 | 10 | 0.0078 | 46 |
| Example 4 | 15 | 0.0117 | 39 |
| Example 5 | 20 | 0.0156 | 31 |
| Example 6 | 25 | 0.0195 | 23 |
| Example 7 | 30 | 0.0235 | 18 |
| Example 8 | 35 | 0.0274 | 14 |
| Example 9 | 60 | 0.0469 | 17 |
| Example 10 | 70 | 0.0547 | 23 |
| Example 11 | 80 | 0.0625 | 27 |
| Example 12 | 100 | 0.078 | 31 |

Comparative Example 1

A MoTi layer having a thickness of 30 nm was formed by a sputtering method by using a MoTi (50:50 at %) alloy target on a glass substrate. Reflectance of the deposited layer was 52%. In order to obtain a value of a light absorption coefficient k, a MoTi single layer was formed on the glass substrate by the same method. Then, a refractive index and a light absorption coefficient were measured by using the ellipsometer. Values of n and k at a wavelength of 380 to 1,000 nm are represented in FIG. 8, and a light absorption coefficient value at a wavelength of 550 nm is 3.18. A value of Equation 1 was calculated as 0.23. The graph representing a comparison of reflectance of Example 1 and Comparative Example 1 is illustrated in FIG. 9.

Comparative Example 2

The method was performed in the same manner as that of Example 1 except that a thickness of a MoTi oxynitride layer was 4 nm. A value of Equation 1 was calculated as 0.003. Reflectance was 53%.

Example 13

A Cu layer having a thickness of 60 nm was formed as a conductive layer on a glass substrate by a direct current power source sputtering (DC sputtering) method using a Cu single target, and a light reflection decreasing layer having a thickness of 35 nm and including $MoTi_aN_xO_y$ ($0<a\leq 2$, $0<x\leq 3$, $0<y\leq 2$) was formed by a reactive DC sputtering method by using a MoTi (50:50 at %) alloy target. Total reflectance according to a wavelength was measured by using Solidspec 3700 (UV-Vis spectrophotometer, Shimadzu Inc.), and a result of the measurement is represented in FIG. 10. A value of Equation 1 of a light reflection decreasing layer is 0.059.

Example 14

A Cu layer having a thickness of 60 nm was formed as a first conductive layer on a glass substrate by a direct current power source sputtering (DC sputtering) method using a Cu single target, a MoTi layer having a thickness of 20 nm was formed as a second conductive layer by a direct current power source sputtering (DC sputtering) method using a MoTi (50:50 at %) alloy target, and a light reflection decreasing layer having a thickness of 35 nm and including $MoTi_aN_xO_y$ ($0<a\leq 2$, $0<x\leq 3$, $0<y\leq 2$) was formed by a reactive DC sputtering method by using the same target. Total reflectance according to a wavelength was measured by using Solidspec 3700 (UV-Vis spectrophotometer, Shimadzu Inc.), and a result of the measurement is represented in FIG. 11. A value of Equation 1 of a light reflection decreasing layer is 0.059.

Example 15

The method was performed in the same manner as that of Example 1 except that a light reflection decreasing layer having a thickness of 87 nm was formed by using an Al layer, in which Al was deposited, instead of a MoTi layer, and using an aluminum oxynitride (k=1.24) instead of a MoTi oxynitride. In this case, a value of Equation 1 is 0.2, and reflectance is about 28%. FIGS. 12 and 13 represent reflectance and an optical constant value implemented with the present structure.

Through the experiment results of the Examples and the Comparative Examples, it can be seen that the structure described in the claims of the present application exhibits an excellent effect of the light reflection decreasing layer.

The invention claimed is:

1. A display device, comprising:

a substrate including a pixel area and a non-pixel area;

a black matrix provided in at least a part of the non-pixel area of the substrate; and a pixel electrode provided in the pixel area of the substrate and a common electrode corresponding to the pixel electrode, wherein the pixel area is divided by a plurality of gate lines and a plurality of data lines, which are provided on the substrate while crossing each other, the non-pixel area includes a wiring unit including a thin film transistor, and the gate line and the data line, the black matrix satisfies 0.004 or more and 0.22 or less of a value of Equation 1 below, and wherein the black matrix comprises a MoTi oxynitride, $$\frac{(k \times t)}{\lambda} \quad \text{[Equation 1]}$$

in Equation 1, k means an extinction coefficient of the black matrix, t means a thickness of the black matrix, and λ means a wavelength of light, and wherein a light reflectance on a surface of the black matrix is 40% or less.

2. The display device of claim 1, wherein a thickness of the black matrix is 10 nm or more and 100 nm or less.

3. The display device of claim 1, wherein an extinction coefficient (k) of the black matrix is 0.1 or more and 2 or less in light of a wavelength of 550 nm.

4. The display device of claim 1, wherein refractive index (n) of the black matrix is 2 or more and 3 or less in light of a wavelength of 550 nm.

5. The display device of claim 1, further comprising:

an insulating layer between the wiring unit and the black matrix.

6. The display device of claim 1, wherein the black matrix is provided to be closer to the substrate than the wiring unit.

7. The display device of claim 1, wherein the black matrix is provided to be farther from the substrate than the wiring unit.

8. The display device of claim 1, wherein the black matrix is provided in the non-pixel area of the substrate, and at least a part of the wiring unit is provided on the black matrix.

9. The display device of claim 1, wherein the display device is a liquid crystal display device, which includes a color filter layer in each pixel area, and includes the pixel electrode and the common electrode provided on the same plane as that of the color filter layer.

10. The display device of claim 1, wherein the display device includes an organic light emitting display device, which includes an organic material layer on each pixel area, the organic material layer being provided between the pixel electrode and the common electrode.

* * * * *